US010074635B2

(12) United States Patent
Tiwari et al.

(10) Patent No.: US 10,074,635 B2
(45) Date of Patent: Sep. 11, 2018

(54) SOLID STATE LIGHT EMITTER DEVICES AND METHODS

(71) Applicant: Cree, Inc., Durham, NC (US)

(72) Inventors: Nishant Tiwari, Apex, NC (US); Colin Kelly Blakely, Franklinton, NC (US); Jesse Colin Reiherzer, Wake Forest, NC (US); Mark Edmond, Raleigh, NC (US); Arthur Fong-Yuen Pun, Durham, NC (US); Michael Bergmann, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/802,655

(22) Filed: Jul. 17, 2015

(65) Prior Publication Data

US 2017/0018538 A1    Jan. 19, 2017

(51) Int. Cl.
| | |
|---|---|
| *H01L 25/075* | (2006.01) |
| *H01L 33/62* | (2010.01) |
| *H01L 33/52* | (2010.01) |
| *H01L 33/50* | (2010.01) |
| *H01L 33/48* | (2010.01) |
| *H01L 25/00* | (2006.01) |

(52) U.S. Cl.
CPC .......... *H01L 25/0753* (2013.01); *H01L 25/50* (2013.01); *H01L 33/486* (2013.01); *H01L 33/507* (2013.01); *H01L 33/52* (2013.01); *H01L 33/62* (2013.01); *H01L 2933/005* (2013.01); *H01L 2933/0033* (2013.01); *H01L 2933/0041* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 4,918,497 | A | 4/1990 | Edmond |
| 4,966,862 | A | 10/1990 | Edmond |
| 5,027,168 | A | 6/1991 | Edmond |

(Continued)

FOREIGN PATENT DOCUMENTS

| | | | |
|---|---|---|---|
| EP | 2757600 A1 | | 7/2014 |
| WO | WO 2014/171301 A1 | | 10/2014 |

OTHER PUBLICATIONS

International Search Report and Written Opinion for Application No. PCT/US2016/042541 dated Oct. 5, 2016.

(Continued)

*Primary Examiner* — Andres Munoz
(74) *Attorney, Agent, or Firm* — Jenkins, Wilson, Taylor & Hunt, P.A.

(57) ABSTRACT

Solid state light emitter devices and methods are provided. A solid state light emitter device can include a submount having an upper surface and a bottom surface. At least first pair and a second pair of electrically conductive contacts can be disposed on the bottom surface of the submount. The first pair of contacts can be electrically independent from the second pair of contacts. The device can further include multiple light emitters provided on the upper surface of the submount. The multiple light emitters can be configured into at least a first light emitter zone that is electrically independent from a second light emitter zone upon electrical communication to a respective pair of contacts.

36 Claims, 7 Drawing Sheets

(56) References Cited

U.S. PATENT DOCUMENTS

| | | |
|---|---|---|
| 5,210,051 A | 5/1993 | Carter |
| 5,278,432 A * | 1/1994 | Ignatius .............. H01L 25/0753 |
| | | 257/723 |
| 5,338,944 A | 8/1994 | Edmond et al. |
| 5,359,345 A | 10/1994 | Hunter |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 6,120,600 A | 9/2000 | Edmond et al. |
| 6,187,606 B1 | 2/2001 | Edmond et al. |
| 6,201,262 B1 | 3/2001 | Edmond et al. |
| 6,600,175 B1 | 7/2003 | Baretz et al. |
| 6,791,119 B2 | 9/2004 | Slater, Jr. et al. |
| 6,853,010 B2 | 2/2005 | Slater et al. |
| 6,958,497 B2 | 10/2005 | Emerson et al. |
| 7,095,056 B2 | 8/2006 | Vitta et al. |
| 7,213,940 B1 | 5/2007 | Van De Ven et al. |
| 7,329,905 B2 * | 2/2008 | Ibbetson .............. H01L 23/481 |
| | | 257/100 |
| 7,456,499 B2 | 11/2008 | Loh et al. |
| 7,564,180 B2 | 7/2009 | Brandes |
| 7,791,061 B2 | 9/2010 | Edmond et al. |
| 8,058,088 B2 | 11/2011 | Cannon et al. |
| 8,563,339 B2 | 10/2013 | Tarsa et al. |
| 8,866,169 B2 | 10/2014 | Emerson et al. |
| 8,940,561 B2 | 1/2015 | Donofrio et al. |
| 9,024,349 B2 | 5/2015 | Chitnis et al. |
| 9,070,850 B2 | 6/2015 | Keller et al. |
| 2006/0197098 A1 | 9/2006 | Aihara |
| 2006/0221272 A1 | 10/2006 | Negley et al. |
| 2006/0289888 A1 * | 12/2006 | Chiang ................. H01L 33/486 |
| | | 257/99 |
| 2007/0104828 A1 | 5/2007 | Fornaguera |
| 2007/0139923 A1 | 6/2007 | Negley et al. |
| 2007/0170447 A1 | 7/2007 | Negley et al. |
| 2007/0223219 A1 | 9/2007 | Medendorp et al. |
| 2007/0253209 A1 | 11/2007 | Loh et al. |
| 2008/0012036 A1 | 1/2008 | Loh et al. |
| 2008/0121921 A1 | 5/2008 | Loh et al. |
| 2008/0179611 A1 | 7/2008 | Chitnis et al. |
| 2008/0198112 A1 | 8/2008 | Roberts |
| 2008/0258130 A1 | 10/2008 | Bergmann et al. |
| 2008/0298063 A1 * | 12/2008 | Hayashi ............ B29C 45/14655 |
| | | 362/249.01 |
| 2008/0308825 A1 | 12/2008 | Chakraborty et al. |
| 2009/0050907 A1 | 2/2009 | Yuan et al. |
| 2009/0050908 A1 | 2/2009 | Yuan et al. |
| 2009/0050911 A1 * | 2/2009 | Chakraborty ........... H01L 33/56 |
| | | 257/89 |
| 2009/0080185 A1 | 3/2009 | McMillan |
| 2009/0184616 A1 | 7/2009 | Van De Ven et al. |
| 2009/0289374 A1 * | 11/2009 | Aoki ................... H01L 25/0753 |
| | | 257/773 |
| 2009/0316409 A1 * | 12/2009 | Kim ..................... H05K 1/0295 |
| | | 362/249.14 |
| 2010/0320483 A1 * | 12/2010 | Kadotani .................. F21K 9/00 |
| | | 257/88 |
| 2013/0301257 A1 * | 11/2013 | Britt .................... H01L 25/0753 |
| | | 362/231 |
| 2014/0228914 A1 | 8/2014 | Van De Ven et al. |
| 2014/0240974 A1 | 8/2014 | Hussell et al. |
| 2015/0349218 A1 | 12/2015 | Reiherzer et al. |

OTHER PUBLICATIONS

Notice of Publication for International Application No. PCT/US2016/042541 dated Jan. 26, 2017.

* cited by examiner

SOLID STATE LIGHT EMITTER DEVICES AND METHODS

TECHNICAL FIELD

The subject matter disclosed herein relates generally to light emitter devices and methods. More particularly, the subject matter disclosed herein relates to solid state light emitter devices and related methods.

BACKGROUND

Solid state light emitters, such as light emitting diodes (LEDs) or LED chips, convert electrical energy into light. In some aspects, LED chips are provided in different types of light emitter devices, for example, in surface mount design (SMD) type of devices for use in a variety of different lighting and optoelectronic applications.

As LED chips are narrow band gap emitters, challenges exist in providing certain colors of light, for example, high quality white light that is natural and/or vivid. Challenges also exist in providing simple and inexpensive solid state lighting solutions.

Manufacturers of LED lighting solutions are constantly seeking ways to reduce their cost in order to provide a lower initial cost to customers, and encourage the adoption of LED products. Devices incorporating fewer raw materials at sustained or increased brightness levels using the same or less power are becoming more desirable.

Despite the availability of various light emitter devices in the marketplace, a need remains for improved devices and methods that have improved color quality, improved color rendering, are more efficient, cost effective, and/or improve the ease of manufacture.

SUMMARY

In accordance with this disclosure, improved light emitter devices and methods are described herein. One exemplary light emitter device comprises a submount having an upper surface and a bottom surface, at least a first pair and a second pair of electrically conductive contacts disposed on the bottom surface of the submount, and multiple light emitters disposed on the upper surface of the submount. The first pair of contacts is electrically independent from the second pair of contacts. The multiple light emitters are configured into at least a first light emitter zone that is electrically independent from a second light emitter zone upon electrical communication to a respective pair of contacts.

Another exemplary embodiment of a light emitter device is provided. The device includes a submount and a plurality of pairs of electrically conductive traces disposed over the submount. Each pair of electrically conductive traces is electrically independent. The device further comprises a plurality of light emitters disposed over the submount. The light emitters are configured in at least two light emitter zones between the plurality of electrically conductive traces, and each light emitter emits light from a light emitter surface that has at least two lines of symmetry about a central axis of the submount.

An exemplary method of providing a solid state light emitter device comprises providing a submount having an upper surface and a bottom surface, providing at least first pair and a second pair of electrically conductive contacts on the bottom surface of the submount, wherein the first pair of contacts is electrically independent from the second pair of contacts. The method further comprises providing multiple light emitters on the upper surface of the submount and electrically configuring the multiple light emitters into at least a first light emitter zone that is electrically independent from a second light emitter zone upon electrical communication to a respective pair of contacts.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1A:
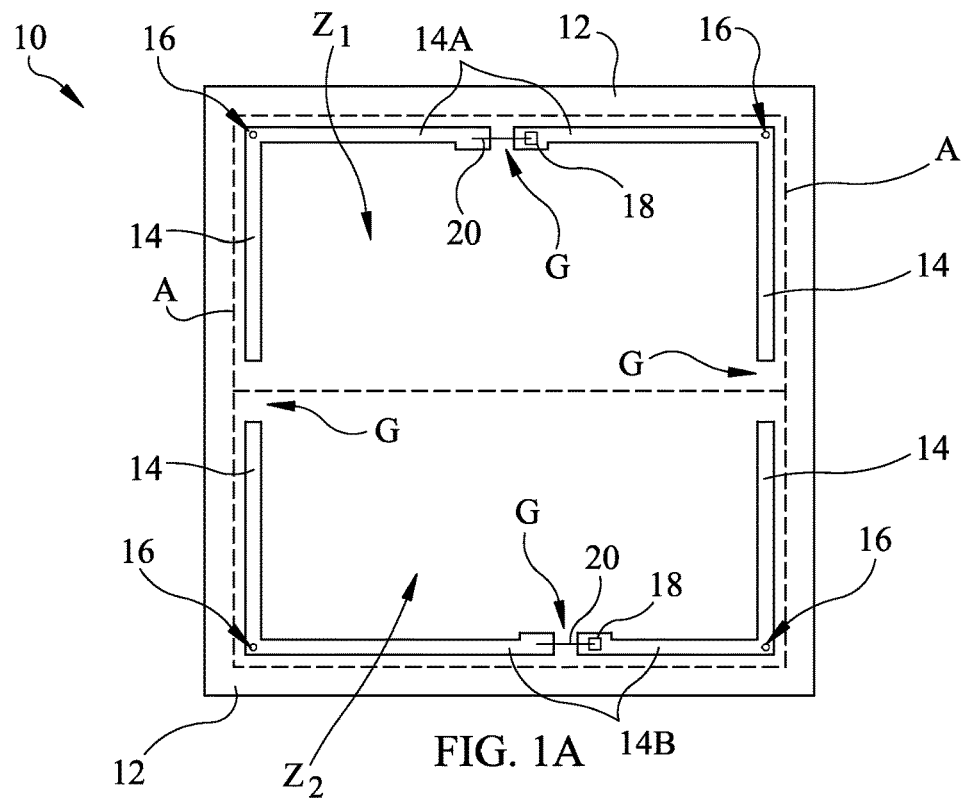
FIGS. 1A to 1C are plan and perspective views illustrating a light emitter device, or portions thereof, according to the disclosure herein.

The subject matter herein discloses solid state light emitter devices and methods, such as submount based light emitting diode (LED) devices and methods. Notably, devices and methods described herein can comprise multiple independent and distinct light emitter zones that are configured to emit light from either a same (e.g. single) light emitter surface or multiple (e.g., divided) light emitter surfaces. In some aspects, devices and methods herein comprise two or more light emitter zones per a single device. Each emitter zone can differ in regards to peak emission(s), color point(s), color temperature(s), chip color(s), chip size(s), chip spacing(s), chip count(s), chip structure(s), string count(s), string spacing(s), voltage, brightness, light output, phosphor material, phosphor content, phosphor loading, encapsulant material, lens material, combinations thereof, or the like. The two or more light emitter zones can differ in respect to any other conceivable characteristic relating to physical, structural, mechanical, dimensional, optical, material, chemical, and/or electrical properties.

Multiple distinct (discrete) light emitter zones can advantageously provide customizable light emissions, improved color mixing, improved color rendering, improved color uniformity, improved color quality, improved thermal properties, improved optical properties, and/or improved ease of manufacture. Providing a single device utilizing two or more independently controllable light emitter zones allows for flexibility in accommodating multiple different lighting applications.

In some aspects, devices herein utilize multiple independent and discrete pairs of electrical contacts and/or traces for supplying electrical current to the multiple light emitter zones. For example, each device can comprise multiple different (discrete) pairs of surface mount contacts (e.g., SMD contact pads) that are disposed on a bottom surface of a device submount. The contact pads are electrically connected to multiple different (discrete) pairs of traces on a top surface of submount. Each pair of contact pads and each pair of traces connected thereto can be individually electrically controllable, where desired, for passing either a same amount or different amounts of current through each light emitter zone for inducing desired light emissions per zone.

The metallic traces on a top surface of the device submount can be spaced apart from the one or more light emitters (e.g., LED chips) on a top surface of a submount and disposed proximate the outermost edges of the submount for reducing any interference with, absorption of, and/or potential blockage of light. Each trace can optionally be disposed below a single, continuous reflective or non-reflective material, such as a single reflector, reflective wall, or "dam". Individual traces can also be disposed below multiple, separate reflective or non-reflective structures or dams. The two or more light emitter zones can be configured to emit light via a same (e.g., single) light emitter surface, or each zone can optionally be separated by one or more optional reflective or non-reflective structures or dams. Each light emitter zone can comprise a regular shape that is symmetric about at least one central axis or plane and has at least one line of symmetry or two or more lines of symmetry about the central axis or plane.

Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein cover such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene.

References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements can be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures were turned over, structure or portion described as "above" other structures or portions would now be oriented "below" the other structures or portions. Likewise, if devices in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

The terms "light emitter" and "light emitter device" as used herein are not limited in any respect other than being capable of emitting light. Light emitters can comprise any type of solid state light emitter or emitter chip, LED chip (packaged, unpackaged, or bare), a laser diode, an organic LED chip, and/or any other semiconductor device arranged as a semiconductor chip that comprises one or more semiconductor layers, which can comprise Si, SiC, GaN, and/or other semiconductor materials.

Light emitters described herein can emit any wavelength and/or color of light. Where multiple light emitters are used, the emitters can each emit a same color of light or different colors/combinations of light. A "color" of light refers to a light emitter's peak wavelength of light/can be primarily blue, primarily red, primarily green, cyan, red-orange (RDO), orange, yellow, blue shifted yellow (BSY), ultraviolet (UV), infrared (IR), or the like.

Light emitters according to embodiments described herein can optionally comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN.

Light emitters according to some embodiments described herein, for example, can optionally be fabricated on growth substrates (e.g., Si, SiC, or sapphire substrates) to provide horizontal chips (with at least two electrical contacts on a same side of the LED chip) or vertical chips (with electrical contacts on opposing sides of the LED chip). In some aspects, the growth substrate can be maintained on the LED chip after fabrication or removed (e.g., by etching, grinding, polishing, etc.). In other aspects, the growth substrate can be removed, for example, to reduce a thickness of the resulting LED chip and/or to reduce a forward voltage through a vertical LED chip. A horizontal chip (with or without the growth substrate), for example, can be flip chip bonded (e.g., using solder) to a carrier substrate or printed circuit board (PCB), or wirebonded. A vertical chip (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB.

Examples of vertical and horizontal LED chips (e.g., or structures) are discussed by way of example in U.S. Publication No. 2008/0258130 to Bergmann et al. and in U.S. Pat. No. 7,791,061 to Edmond et al., which issued on Sep. 7, 2010, the disclosures of which are hereby incorporated by reference herein in their entireties.

Light emitters according to some embodiments described herein can optionally be at least partially coated with one or more lumiphoric materials, phosphoric materials, or phosphors. These materials are configured to absorb a portion of light emitted by the LED chip and emit light at a different wavelength, allowing the resultant light emitter device to emit a combination of light from each of the LED chip and the phosphor. In one embodiment, light emitter devices described herein emit what is perceived as white light resulting from a combination of light emission from the LED chip and the phosphor.

In some embodiments according to the present subject matter, white emitting devices include one or more LED chips that emit light in the blue wavelength spectrum and one or more phosphors that absorb some of the blue light and re-emit light in the green, yellow, and/or red wavelength spectrum. The devices can therefore emit a white light combination across the visible spectrum of light. In other embodiments, the LED chips can emit a non-white light combination of blue and yellow light as described in U.S. Pat. No. 7,213,940, the entire contents of which is incorporated herein by reference. Providing light emitters that emit red light or emitters covered by a phosphor that absorbs light and emits a red light are also contemplated herein. Red and blue light emitters can be discussed herein by way of example only; however, light emitters are not limited to emission of red and blue light. Rather, light emitters described herein can emit any color of light, UV light, and/or IR light. It is understood that light emitter devices and methods according to the present subject matter can also have multiple LED chips of different colors, one or more of which can be white emitting.

Where used, phosphor(s) can be applied to a light emitter and/or light emitter device according to any suitable method, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating light emitters are described, for example, in U.S. Pat. No. 8,058,088, which issued on Nov. 15, 2011, and U.S. patent application Ser. No. 12/717,048, the disclosures of which are hereby incorporated by reference herein in their entireties. Light emitters can be coated using other methods such as electrophoretic deposition (EPD), with a suitable EPD method described in U.S. patent application Ser. No. 11/473,089, which is also incorporated herein by reference in its entirety.

Some embodiments of the instant subject matter can comprise light emitters, luminescent materials, and/or methods such as those described in, for example, U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918, 497, U.S. Patent Application Publication Nos. 2009/ 0184616; 2009/0080185; 2009/0050908; 2009/0050907; 2008/0308825; 2008/0198112; 2008/0179611, 2008/ 0173884, 2008/0121921; 2008/0012036; 2007/0253209; 2007/0223219; 2007/0170447; 2007/0158668; 2007/ 0139923, and/or 2006/0221272; and U.S. patent application Ser. No. 11/556,440, with the disclosures of each of the foregoing patents, published patent applications, and patent application serial numbers being hereby incorporated by reference as if set forth fully herein.

FIGS. 1A through 3E illustrate various embodiments of solid state light emitter devices and related methods according to the present subject matter as disclosed and described herein. In some aspects, devices and methods described herein comprise submount based surface mount design (SMD) light emitter devices, which are adapted for connection to portions of an electrical circuit, circuitry, a heat sink, and/or any other electrically or thermally conductive surfaces. Light emitter devices and methods herein can be formed over a panel substrate of material, processed as a batch of devices, and singulated from the panel as described, for example, in U.S. patent application Ser. No. 14/292,331, filed on May 30, 2014, the disclosure of which is hereby incorporated by reference herein in the entirety.

Figure 1B:
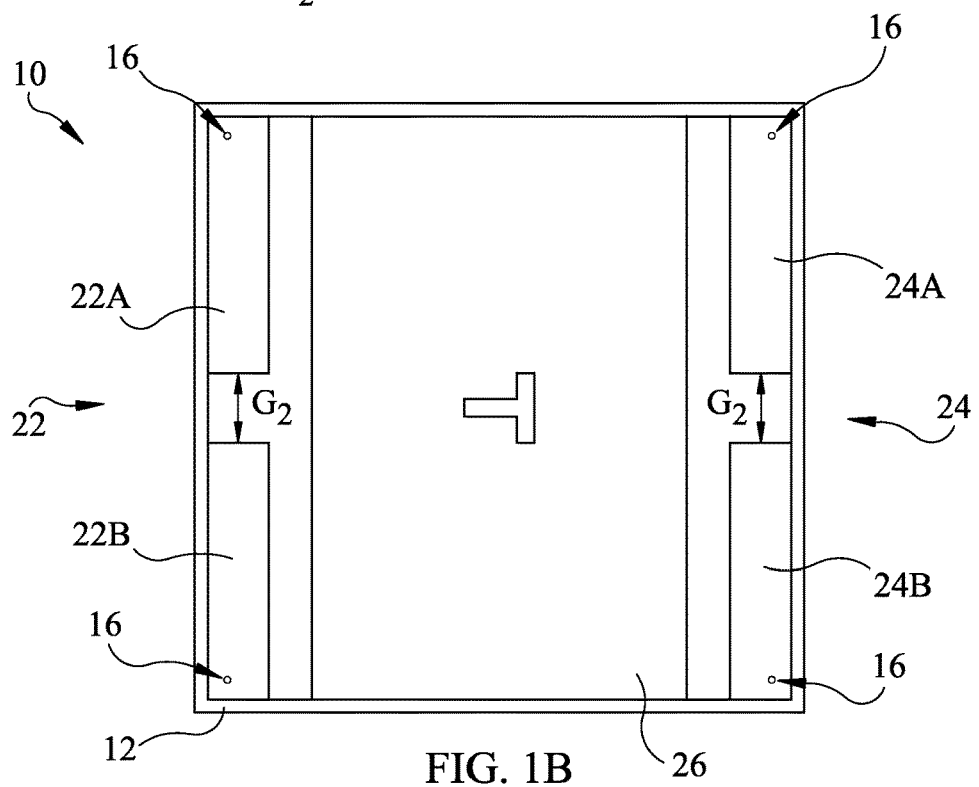
Figure 1C:
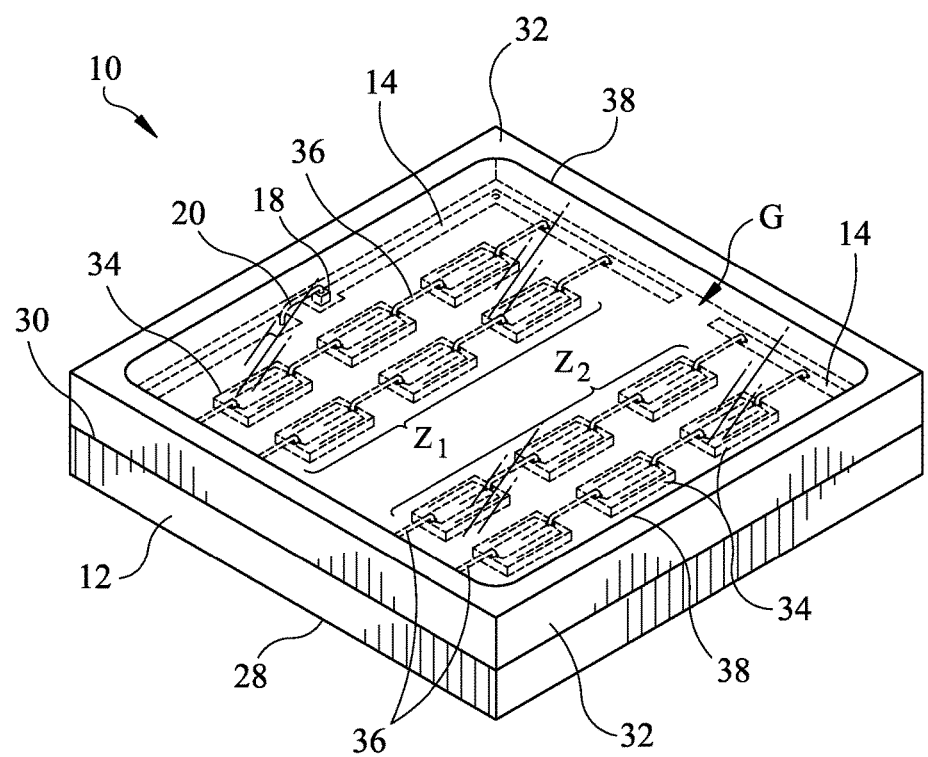

FIGS. 1A to 1C illustrate a first embodiment of a light emitter device, generally designated 10. For simplicity and illustration purposes only, FIG. 1A illustrates device 10 without light emitters, however, light emitters are illustrated in FIG. 1C. Device 10 can comprise a submount 12 configured to support multiple light emitters. As described herein, the multiple light emitters can be configured into at least two (e.g., or more than two) light emitter zones. Each light emitter zone can comprise at least one light emitter, and in some aspects, multiple light emitters.

Devices 10 described herein can be physically (dimensionally) scaled up or down to accommodate any suitable dimensional attribute requested by a customer and/or consumer, for example, device 10 can comprise a submount 12 having a length and a width measuring approximately 2.5 millimeters (mm)×2.5 mm or more, approximately 5 mm×5 mm or more, or approximately 7 mm×7 mm or more. Submount 12 can comprise any shape that is square, non-square (e.g., circular, triangular, etc.), rectangular, or non-rectangular. Any size and/or shape of submount 12 can be provided. Submount 12 can also comprise any thickness, such as for example between approximately 0.25 mm and 2.0 mm thick. In some aspects, submount 12 is approximately 0.6 mm, or 0.635 mm thick. Dimensional attributes as described herein are exemplary, and any length, width, diameter, thickness, etc., of submount 12 can be provided.

Submount 12 can comprise any material requested by a customer, consumer, and/or any material that is application-specific (e.g., an electrically insulating material, a thermally conductive material, etc.). Submount 12 can comprise a metal or a metallic material, a non-metallic material, a composite material, a ceramic material, a laminate structure, a multi-layered material (e.g., PCB, MCPCB, etc.), a flexible material, or the like. In some aspects, submount 12 is a ceramic material that is highly reflective to visible light (e.g., greater than about 90%) and provides mechanical support for and/or conduction of heat away from multiple light emitters. In some aspects, submount 12 comprises a substantially white, silvery white or transparent ceramic based material that is configured to improve light extraction and reflectance per device 10.

Submount 12 can comprise a highly reflective aluminum oxide (e.g., alumina or $Al_2O_3$), aluminum nitride (AlN), zirconia ($ZrO_2$), etc., having optional reflective particles dispersed therein. Exemplary materials for providing a panel and submounts 12 singulated therefrom are described in U.S. utility patent application Ser. No. 11/982,275, filed on Oct. 31, 2007 and/or U.S. utility patent application Ser. No. 12/757,891, filed on Apr. 9, 2010. The entire contents of each of these references are hereby incorporated by reference herein.

In some aspects, submount 12 can comprise a surface over which one or more light emitters (34, FIG. 1C) can be supported, mounted, and/or attached. Notably, device 10 can comprise a single and/or continuous mounting area A disposed over submount 12 for supporting multiple light emitters (34, FIG. 1C). Mounting area A is illustrated in broken lines for illustration purposes only, as it can include any size, shape region, and/or portion of submount 12 to which light emitters attach. Mounting area A can comprise a planar surface, a non-planar surface, or a combination of planar and non-planar surfaces over which light emitters are provided.

Device 10 further comprises a plurality of electrically conductive contacts or traces 14 for passing electrical current into one or more light emitters (e.g., 34, FIG. 1C). In some aspects, light emitters (e.g., 34, FIG. 1C) that are disposed over mounting area A can be electrically and/or physically configured into multiple discrete and/or distinct light emitter zones for providing a single device 10 having improved color mixing, improved color quality, and/or improved color uniformity. For example, light emitters (e.g., 34, FIG. 1C) can be physically die attached, arranged, positioned, and/or otherwise provided within a first light emitter zone $Z_1$ and a second light emitter zone $Z_2$. First and second light emitter zones $Z_1$ and $Z_1$, respectively, can be but do not have to be spatially distinct (e.g., visibly discrete). First and second light emitter zones $Z_1$ and $Z_2$, respectively, can be electrically separate or independent such that each zone can be independently controllable, where desired.

In some aspects, at least a first pair of traces generally designated 14A and at least a second pair of traces generally designated 14B can be provided over submount 12 for independently supplying electrical current to one or more light emitters (e.g., 34, FIG. 1C) disposed there between. Thus, first and second zones $Z_1$ and $Z_2$ can be electrically and/or physically distinct or discrete. First pair of traces 4A can pass electrical current through one or more light emitters disposed in first light emitter zone $Z_1$, and second pair of traces 14B can pass electrical current through one or more light emitters disposed in second light emitter zone $Z_2$. More than two pairs of traces 14 can be provided per device 10 and/or more than two light emitter zones $Z_1$ can be provided per device 10, where desired (see e.g., FIG. 3E).

In some aspects, first and second pairs of traces 14A and 14B can each comprise an anode trace and a cathode trace for collectively passing current into one or more light emitters (e.g., 34, FIG. 1C) electrically connected thereto. Each trace 14 can comprise an area of electrically conductive material, such as metal or a metal alloy that is disposed over submount 12. Traces 14 can be provided on or over a top side or surface of submount 12 via sputtering, electroplating, electroless plating, depositing (e.g., via chemical, plasma, vapor, and/or physical deposition techniques), lithography processing, photoresist processing, stenciling, and/or any other known process or technique. Traces 14 can be thin and optionally comprise one or more layers of material. Traces 14 can, but do not have to be, disposed proximate outermost areas of submount 12 and optionally covered with a reflective or non-reflective structure (e.g., walls 32, FIG. 1C). The size, shape, number, location, thickness, and/or material of traces 14 can be customized for use in a variety of different lighting applications.

Individual traces 14 (e.g., anode and cathode traces) can be physically separated by a gap G. Electrical current can be communicated to traces 14 from electrical contacts or pads (e.g., 22A, 22B, 24A, and 24B, FIG. 1B) disposed on a bottom surface of submount 12 by electrically conductive through-holes or vias, generally designated 16. Notably, traces 14 and bottom contacts (22A, 22B, 24A, and 24B, FIG. 1B) can be electrically configurable such that device 10 can effectively become split into first light emitter zone $Z_1$ and second light emitter zone $Z_2$. Light emitters (34, FIG. 1C) can be mounted to submount 12 and electrically connected to a respective set of traces (e.g., first pair 14A or second pair 14B) per zone. For example, first pair of traces 14A can be configured to supply electrical current to light emitters (34, FIG. 1C) disposed in first zone $Z_1$ and second pair of traces 14B can be configured to supply electrical current to light emitters (34, FIG. 1C) disposed in second zone $Z_2$. A broken line is shown between first and second zones $Z_1$ and $Z_2$ for illustration purposes only to illustrate a pseudo-boundary therebetween. In some aspects, a physical barrier, wall, dam, structure, material, mirror, reflector, or the like, can be disposed between first and second zones $Z_1$ and $Z_2$, respectively, however, a physically divisive, partitioning structure is not required.

Notably, providing light emitters over a same (single, continuous) centralized surface or mounting area A that is devoid of apertures or holes can be advantageous in terms of thermal dissipation and/or thermal management, as mounting area A can be provided over an external heat sink (not shown) or other component to more effectively spread heat and/or draw heat away from the mounting surface or area A. After die attaching one or more light emitters (34, FIG. 1C) to mounting area A, light emitter zones $Z_1$ and $Z_2$ can then be physically partitioned or divided via structures or barriers, however, physical separation of each zone is not required. Light emitted by emitters mounted within each emitter zone $Z_1$ and $Z_2$ can be emitted from a same light emitter surface as illustrated in FIG. 1C, or from multiple, physically divided light emitter surfaces as illustrated by FIGS. 2B to 2D.

Still referring to FIG. 1A and in some aspects, the amount of electrical current supplied to each light emitter zone (e.g., $Z_1$ and $Z_2$) and/or the voltage range associated with each zone can be substantially the same or different, thereby providing devices 10 that can be configured or customized in regards to electrical, thermal, physical, and/or optical properties or characteristics. In one exemplary embodiment, device 10 can comprise customized in regards to electrical properties by providing different quantities of light emitters and/or strings of serially connected light emitters per zone, which can provide a single device 10 having emitter zones $Z_1$ and $Z_2$ that are operable a both low and/or high voltages. Similarly, in another exemplary embodiment, device 10 can comprise customized optical properties by providing different colors, chip or string spacing, and/or patterns of light emitters per zone, which can provide a device 10 having improved color mixing and/or uniformity. In a further exemplary embodiment, device 10 can be customized according to thermal properties. For example, heat can be more highly concentrated in zones that have larger quantities or populations of light emitters. To compensate for this, a lower current can be supplied to light emitters in the more highly populated zones to allow the light emitters in that respective zone to run cooler at steady state, which improves brightness and efficiency. Providing a single device having multiple (different) configurable and/or customizable light emitter zones $Z_1$ and $Z_2$ can provide devices having improved color mixing, color uniformity, thermal management, and/or overall improved efficiency.

Still referring to FIG. 1A and in some aspects, electrically conductive vias 16 are provided for facilitating electrical communication between bottom contacts (e.g., 22A to 24B, FIG. 1B) and traces 14. Electrical current is then passed from traces 14 to light emitters (e.g., 34, FIG. 1C) connected thereto. Vias 16 can comprise a plurality of openings, apertures, and/or holes extending through portions of submount 12. Vias 16 pass electrical current between bottom contact/pads (FIG. 1B) and top traces 14. Vias 16 can be, but do not have to be, vertically aligned or parallel with respect to a submount thickness or vertical axis. Vias 16 can be filled and/or plated with electrically conductive material, such that top contacts or traces 14 can electrically communicate with bottom contacts or pads (e.g., 22A, 22B, 24A, and 24B, FIG. 1B). Bottom pads (FIG. 1B) can be disposed on a backside or surface of submount 12, which opposes the front side or surface upon which light emitters and traces 14 are provided. Vias 16 can extend between the front and back surfaces of submount 12. Vias 16 can be formed in submount 12 via etching, drilling (e.g., laser or non-laser drilling), scribing, punching, machining, or the like, such that the vias 16 penetrate internally and extend within a portion of submount 12. In some aspects, vias 16 can be formed using batch processing step(s) (e.g., drilling, plating, etc.) prior to singulation of device 10 and respective submount 12 from a larger panel of devices.

Still referring to FIG. 1A and in some aspects, at least one electrostatic discharge (ESD) protection device 18 can be provided per trace 14, such as first and second pairs of traces 14A and 14B, respectively. At least one ESD protection device 18 can electrically communicate to each pair (e.g., 14A, 14B) of traces via one or more wirebonds 20. ESD protection device 18 can be reversed biased between traces 14 with respect to light emitters (FIG. 1C) for preventing excessive current from passing through device 10 during an ESD event. ESD protection devices 18 provide an alternative path for electrical current to flow into and prevent ESD failures and/or damage to light emitters. Exemplary ESD protection devices 18 as described, for example, in U.S. patent application Ser. No. 14/292,331, filed on May 30, 2014, the disclosure of which was previously incorporated by reference herein in the entirety hereinabove. In some aspects, each ESD protection device 18 is embedded or covered by one or more structures (e.g., walls, dams, etc.) so that it does not block and/or absorb a significant amount of light.

Notably, traces 14 and ESD protection device 18 can optionally be disposed proximate and/or confined to outermost edges of submount 12, such that each terminates under, below, and/or within portions of one or more walls (e.g., 32, FIG. 1C). Wirebonds 20 extending from each ESD protection device 18 can also terminate under, below, and/or within portions of the dam or wall (e.g., 32, FIG. 1C). Stated differently, device 10 comprises an SMD in which electrical traces 14, wirebonds 20, and/or ESD protection devices 18 can be concealed (e.g., fully or at least partially) by and/or within walls 32 (FIG. 1C). Traces 14 are either fully concealed via walls (e.g., 32, FIG. 1C) or covered with a filler material (38, FIG. 1C). In some aspects, device 10 is devoid of uncovered traces 14 on a top surface thereof. In some aspects, any type of electrical component can be provided below and/or within wall (32, FIG. 1C). For example, a thermistor, resistor, capacitor, transistor, or the like, may also be covered and/or concealed by a wall (32, FIG. 1C) of device.

FIG. 1B illustrates a bottom view of device 10 that opposes the view in FIG. 1A. Referring now to FIG. 1B, device 10 comprises a first side or edge 22 and an opposing, second side or edge 24. A plurality of electrical pads or contacts (e.g., SMD pads or contacts) is disposed along each of first and second edges 22 and 24, respectively. For example, a first pair of pads or contacts 22A and 22B is disposed along first edge 22 and a second pair of pads or contacts 24A and 24B is disposed along second edge 24. A gap $G_2$ is disposed between each pair of contacts. A thermal element 26 is disposed between first and second edges 22 and 24, respectively. Thermal element 26 can be configured to draw heat away from the light emitters, and dissipate it to an external heatsink (not shown). Electrical contacts 22A to 24B are illustrated in one exemplary embodiment only. Any size, shape, location, orientation, and/or configuration of contacts 22A to 24B can be provided.

Notably, contacts 22A and 22B on first edge 22 can each comprise a same electrical polarity and contacts 24A and 24B on second edge 24 can comprise a same electrical polarity that opposes the electrical polarity of contacts on first edge 22. In some aspects, contacts 22A and 22B each comprise anodes and contacts 24A and 24B each comprise cathodes. Anode contacts (e.g., 22A and 22B) and cathode contacts (e.g., 24A and 24) collectively form independently controllable anode-cathode pairs for passing separate electrical current between traces (14, FIG. 1A) and light emitters (e.g., 34, FIG. 1C) connected thereto. For example, contact 22A and contact 24A are configured to collectively pass electrical current to light emitters in first zone $Z_1$ (FIG. 1A) and contact 22B and contact 24B are collectively configured to pass electrical current to light emitters in second zone $Z_2$ (FIG. 1A). Each anode/cathode pair of contacts (e.g., a first anode/cathode pair 22A/24A and a second anode/cathode pair 22B/24B) is electrically independent from each other anode/cathode pair(s) of contacts, and can supply different amounts of current to each light emitter zone, where desired. Just as device 10 utilizes multiple pairs of traces (e.g., 14A, 14B, FIG. 1A), device 10 likewise utilizes multiple pairs of contacts, where a first pair of contacts comprises 22A and 24A and a second pair of contacts comprises 22B and 24B. Each pair of traces (14A, 14B, FIG. 1A) is electrically connected to respective pair of contacts. More than two pairs of contacts and more than two zones can be provided per device 10.

In some aspects, contacts 22A, 22B, 24A, and 24B comprise SMD pads or contacts configured to electrically communicate with an external circuit, and optionally thermally communicate with an external heat sink. In some aspects, the circuit is also the heat sink. In other aspects, the heat sink and circuit can comprise separate components. Contacts 22A, 22B, 24A, and 24B can electrically communicate with traces 14 (FIG. 1A) by the one or more internally disposed vias 16.

Contacts 22A, 22B, 24A, and 24B can comprise metallic bodies or portions of electrically conductive material that can be attached to submount 12 via adhesive, solder, glue, epoxy, paste, silicone, or any other material. In other aspects, contacts 22A, 22B, 24A, and 24B can comprise metallic bodies or portions of material that can be pressed into a green ceramic tape and then co-fired with submount 12. In other yet further aspects, contacts 22A, 22B, 24A, and 24B can be applied to submount 12 via plating, sputtering, conductive paste screen-printing, or the like. In some aspects, a conductive Ag paste can be used to form contacts 22A, 22B, 24A, and 24B.

Referring now to FIG. 1C, a perspective top view of device 10 is shown. Device submount 12 comprises a bottom surface 28 over which contacts (e.g., 22A, 22B, 24A, and 24B) are disposed and an upper surface 30 over which traces 14, at least one dam (e.g., retention structure) or wall 32, and one or more light emitters 34 are disposed. A filler material 38 is disposed between inner surfaces of wall 32, for example, in a cavity formed by wall 32. Features disposed below wall 32 and filler material 38 are indicated in broken lines, as such features are present, but may not be visible from the outside of device 10. Filler material 38 can comprise a substantially symmetric (regular) shaped light emitter surface that is configured to emit light generated by light emitters 34 disposed below filler material 38. The light emitter surface of filler material 38 can be subdivided via one or more additional structures or partitions (e.g., 52, 54

FIGS. 2B to 2D). However, each subdivided structure or portion of filler material 38 can also be symmetric about a central axis, and in some aspects comprise multiple lines of symmetry about the central axis. Filler material 38 is optional, and in some aspects device 10 comprises a molded lens or a lens-less device.

A plurality of light emitters 34 can be disposed over submount 12. Light emitters 34 can comprise LED chips that are electrically connected in series and/or parallel between pairs of traces 14 (e.g., an anode/cathode pair). Any size (dimension) of light emitters 34 can be provided, for example, chips that are 1 mm×1 mm or smaller may be provided, for example, chips that are 250 μm×250 μm, 350 μm×350 μm, 500 μm×500 μm, etc. Any size, shape, color, and/or quantity of emitters 34 can be provided per zone. At least two pairs (e.g., 14A, 14B) of traces 14 can be provided per device 10, where a first pair of traces (e.g., 14A, FIG. 1A) supplies electrical current to light emitters 34 in first zone $Z_1$ and a second pair of traces (e.g., 14B) supplies electrical current to light emitters 34 in second zone $Z_2$. Each pair of traces 14 can supply electrical current to light emitters 34 via wires and/or wirebonds 36. Notably, traces 14 and at least some wirebonds 36 can be at least partially or fully disposed under, below, and/or within wall 32.

In some aspects, light emitters 34 are physically and/or electrically configured in multiple different and electrically independent light emitter zones (e.g., $Z_1$ and $Z_2$). Each zone can emit light through a single, undivided portion of filler material 38 and from a single, undivided light emitter surface (e.g., an upper surface of filter material 38). In other aspects, light emitters 34 in multiple light emitter zones (e.g., $Z_1$ and $Z_2$) can emit light from separate portions of filler material (e.g., FIG. 2B) having separate light emitter surfaces. Notably, light emitters 34 configured within multiple light emitter zones (e.g., $Z_1$ and $Z_2$) are electrically independent, so that each zone is addressed individually. Light emitted from each zone (e.g., $Z_1$ and $Z_2$) can combine, mix, and emit the mixed light from a single, same (undivided) light emitter surface. Color uniformity and/or quality (e.g., higher CRI, brighter light, more vivid light, more natural white light, etc.) can be improved via multi-zone light emission.

In some aspects, a single light emitter 34 is provided per zone (e.g., $Z_1$ and $Z_2$). In other aspects, multiple light emitters 34 are provided per zone. Any combination could be used. Where multiple light emitters 34 are provided per zone, the emitters can be serially connected in one or more strings of emitters. Each string of light emitters 34 can be electrically connected to other strings in parallel. Different sizes, shapes, spacings (chip and string spacings), structures, quantities, colors, and/or electrical connectivity of light emitters 34 can be provided in different zones (e.g., $Z_1$ and $Z_2$). The sizes, shapes, spacing, structures, colors, quantities, and/or connectively of emitters 34 provided per zone (e.g., $Z_1$ and $Z_2$) can be customized for use in various different lighting applications and/or at various different voltages for providing a desired color and/or light output from device 10.

Still referring to FIG. 1C and in some aspects, wall 34 comprises a reflective material (e.g., a reflector), a non-reflective material, a light-absorbing material, a light blocking material, a clear (transparent) material, a white material, a particle loaded (e.g., reflective or light scattering particles), a phosphor loaded material, a black material, or the like. Using a clear wall may be advantageous by increasing or promoting color mixing between light emitter zones, improve uniformity, and/or for increasing the viewing angle associated with device 10. Wall 32 can be formed by any method or technique. For example, wall 32 can comprise a dispensed dam of material or a molded material. Wall 32 can comprise a single, integral and continuous layer of material disposed over submount 12, or wall 32 can be comprised of multiple non-integral, non-overlapping wall portions. Any size, shape, and/or configuration of wall 32 can be provided.

Filler material 38 can be retained via wall 32. In some aspects, filler material 38 is dispensed between portions of at least two opposing inner surfaces of wall 32 via a dispensing member or tool. In other aspects, filler material 38 can be at least partially molded and cured. Filler material 38, or any portion thereof over (e.g., over different zones), can comprise a texturized surface, a filtering surface, a diffusing surface, or the like. Filler material 38 can comprise an optical element for producing a certain shape, color, and/or beam pattern of light. Filler material 38 can comprise a planar surface, a curved surface, a domed surface, and/or combinations thereof.

In some aspects, filler material 38 comprises an encapsulant, where at least a portion of the encapsulant is disposed on a same side or surface of submount 12 to which light emitters 34 are mounted, and/or a same side or surface to which traces 14 are deposited. In some aspects, filler material 38 is formed directly or indirectly over a top surface of submount 32, and disposed directly over at least one light emitter 34. In some aspects, filler material 38 can comprise a silicone matrix, encapsulant, or a plastic material, which can be deposited or dispensed directly over submount 12 without incurring time or expense associated with overmolding a lens. Filler material 38 can be dispensed to any height between surfaces of wall 32, and can comprise a height that is flush with, greater than, or less than a height of an upper surface of wall 32. In some aspects, filler material 38 can come over and cover the top and/or sides or surfaces of wall 32.

Filler material 38 can provide both environmental and mechanical protection of device 10. In some aspects, an optional layer of optical conversion material(s), such as phosphor(s) or lumiphor(s), can be applied directly over the one or more light emitters 34 and/or over one or more surfaces of filler material 38 (e.g., an inner, outer, upper, or lower surface) for producing cool and/or warm white output. In other aspects, optical conversion material is uniformly or non-uniformly dispersed within filler material 38. Optical conversion material can comprise one or more phosphors or lumiphors (e.g., yellow, red, and/or green phosphor) which become activated by light emitted from the one or more light emitters 34. In some aspects, optical conversion material is provided when filler material 38 is in liquid form and fixed therein as filler material 38 cures.

Notably, device 10 is devoid of a costly leadframe encased within molded plastic, but rather utilizes thin electrically conductive traces 14, which can be customized with respect to size, quantity, placement, layout, and/or electrical configuration with respect to light emitters 34 and bottom contacts (e.g., 22A, 22B, 24A, 24B, FIG. 1B). Individual light emitter devices 10 can each comprise an individual submount 12 over which multiple light emitters 34 are physically and/or electrical configured into multiple light emitter zones ($Z_1$, $Z_2$) for providing customized light emission.

FIGS. 1A to 1C are exemplary only, and as will be appreciated by those of skill in the art, aspects of the light emitters, traces, reflectors and/or optical elements can be customized to provide light emitter devices operable at various electrical and/or optical specifications per customer and/or consumer requests.

FIGS. 2A to 2D illustrates various embodiments of different light emitter zone characteristics, including but not limited to different light emitters (e.g., different placement, sizes, shapes, spacing, electrical configuration, etc.) per zone within solid state light emitter devices. Each device in FIGS. 2A to 2D comprise a submount 42, multiple light emitters 44 disposed over submount 42, a plurality of wires 46 extending from the one or more light emitters 44, and a wall or retention structure 48 disposed over submount 42. Retention structure 48 covers one or more electrical devices, such as ESD protection devices (FIG. 1C) and/or wires 46. Retention structure 48 is configured to retain a filling material (e.g., 38, FIG. 1C) and can comprise any material (e.g. a reflector, a mirror, a non-reflective material, etc.). Retention structure 48 can be disposed over and cover traces (e.g., 14, FIG. 1A) and/or vias (e.g., 16, FIG. 1A), however, the traces and vias are not shown in FIGS. 2A to 2D for illustration purposes.

Figure 2A:
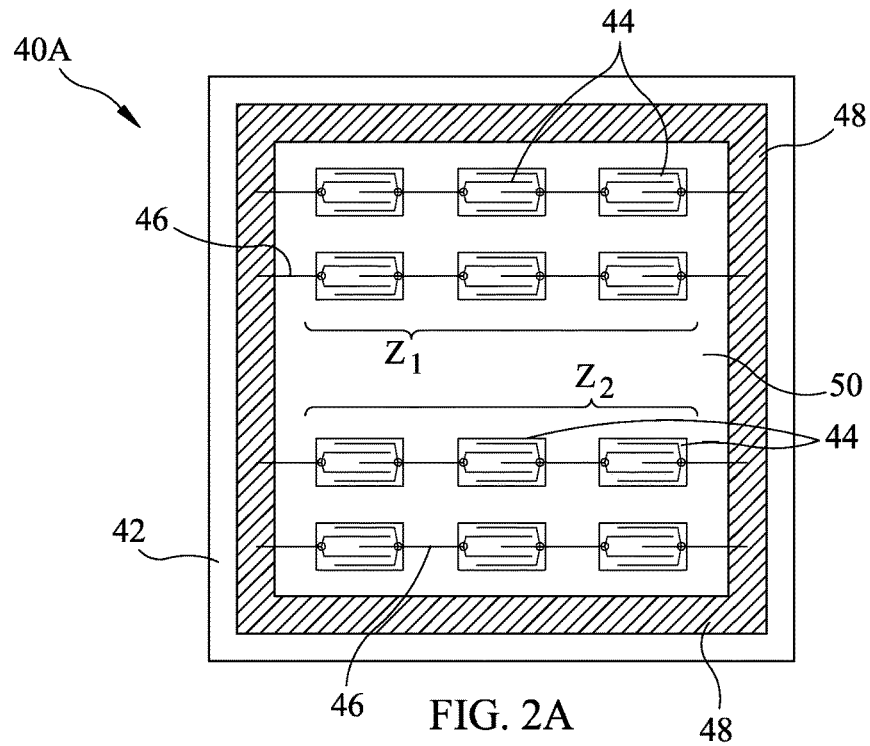
FIGS. 2A to 2D are top plan views illustrating optional characteristics associated with light emitter devices according to the disclosure herein.
Figure 2B:
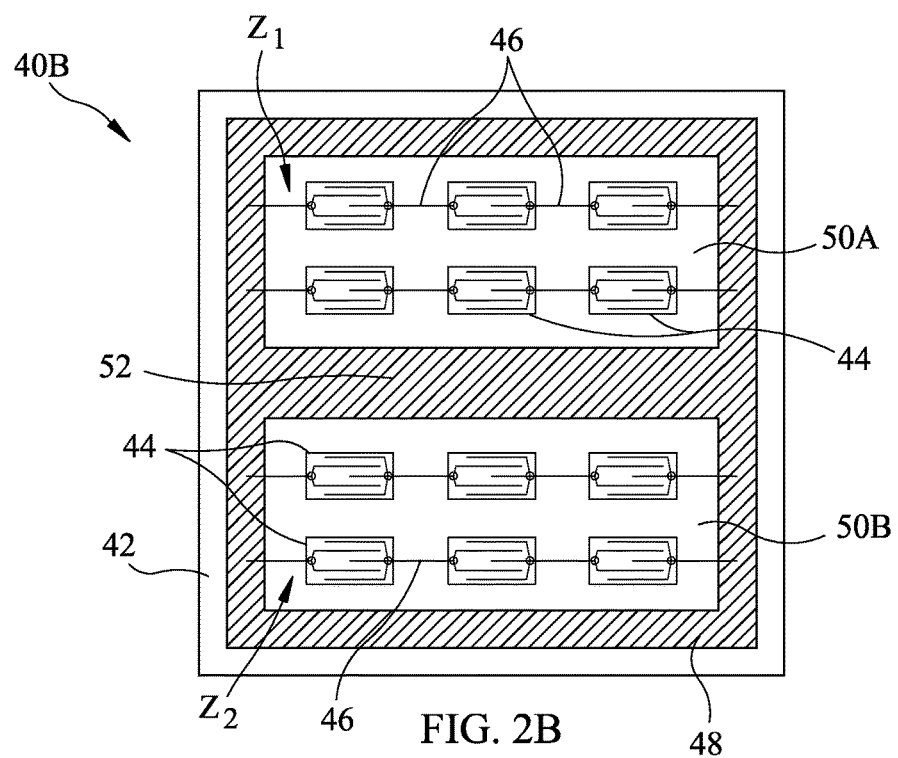
Figure 2C:
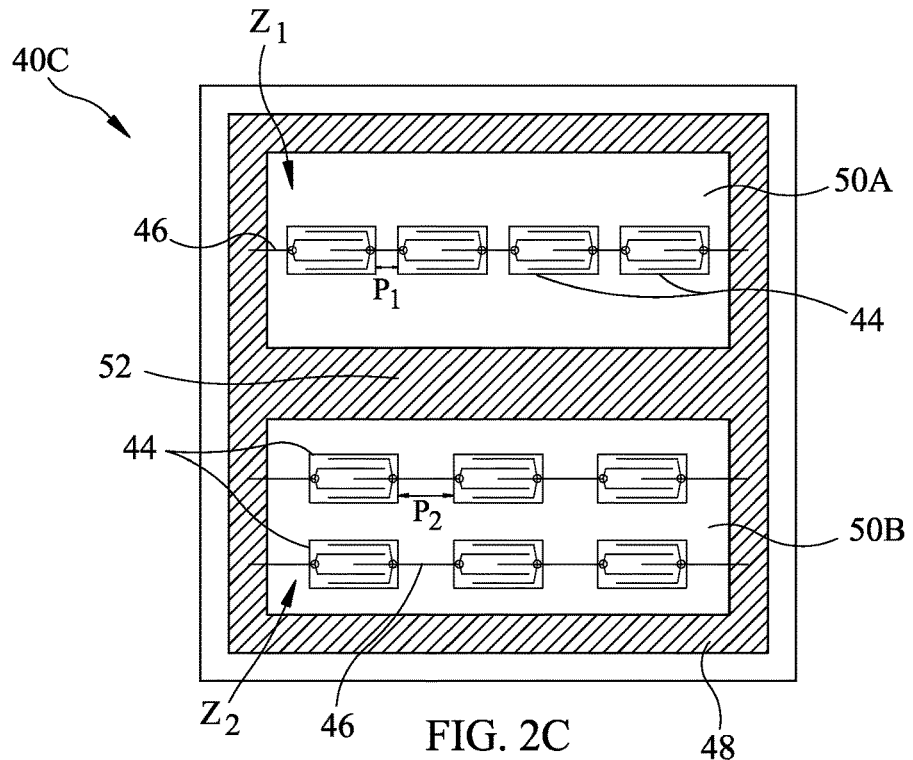
Figure 2D:
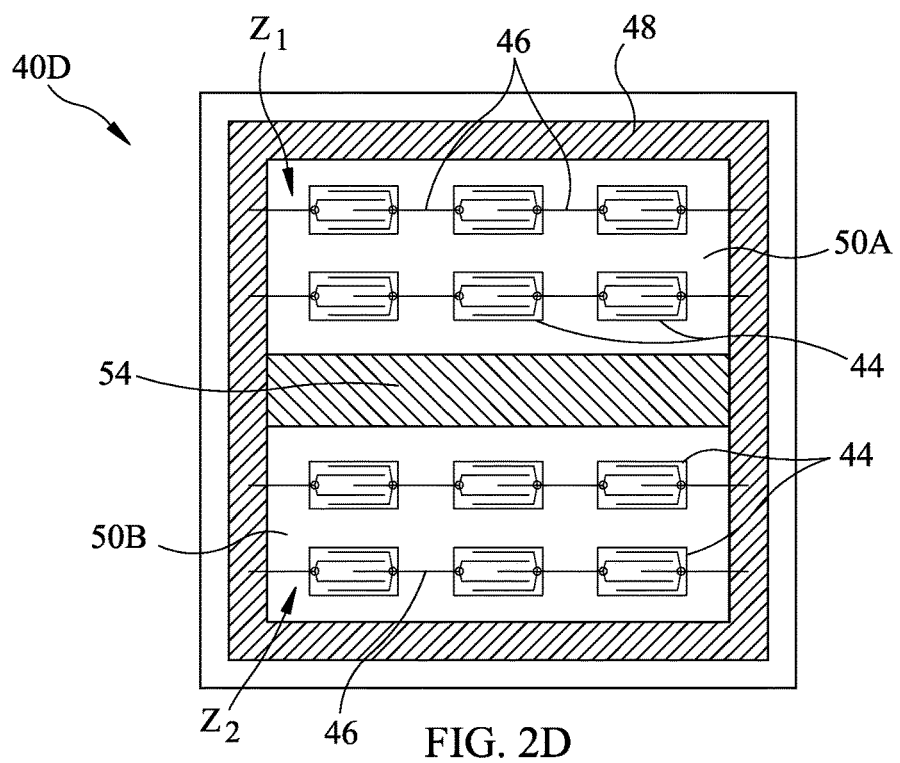

FIG. 2A illustrates a first solid state light emitter device, generally designated 40A. Device 40A includes a first light emitter zone $Z_1$ and a second light emitter zone $Z_2$ configured over a mounting surface. Each zone $Z_1$ and $Z_2$ comprise at least one light emitter 44 that receives electrical current from a pair of traces (e.g., 14A, 14B, FIG. 1A). In some aspects, multiple strings of serially connected light emitters 44 are provided over submount 42. Each string of light emitters 44 can be connected in parallel between the respective pair of traces (e.g., 14A, 14B, FIG. 1A). In some aspects, light emitters 44 comprise LED chips configured to emit light that is primarily blue, primarily red, primarily green, cyan, amber, RDO, BSY, UV, IR, or the like, upon activation with electrical current. Notably, the quantity, size, shape, orientation, structure, number of strings, and/or electrical connectivity of light emitters can vary per zone. A single device 40A is customizable and/or configurable in regards to color, size, voltage, thermal properties, optical properties, physical properties, electrical properties, or the like. In some aspects, the quantity, size, shape, orientation, structure, number of strings, and/or electrical connectivity of light emitters can be the same per zone. In other aspects, each zone is different. Any arrangements and/or connectivity of light emitters can be provided, where each zone is independently addressable.

As FIG. 2A illustrates, first and second light emitter zones $Z_1$ and $Z_2$ can emit light from a same light emitter surface 50. The light emitter surface can comprise a surface of submount 42 or a surface of a filler material (not shown) disposed between portions of retention structure 48. Emitting light from a single light emitter surface or area 50 can advantageously allow light from separately driven (independent) LED chips to mix for improving color uniformity and/or allow provision of specific beam patterns or shaping. Any number of light emitter zones $Z_1$ and $Z_2$ can be provided per device 40A. LED chips (e.g., 44) can be configured to activate a yellow, red, and/or green phosphor disposed either directly over the chips, dispersed within at least one layer of filler material (e.g., 38, FIG. 1C) and/or over or within a portion of retention structure 48 for producing cool and/or warm white output.

FIG. 2B is another embodiment of a solid state light emitter device generally designated 40B. Device 40B comprises an intermediate structure 52 disposed between first light emitter zone $Z_1$ and second light emitter zone $Z_2$. Structure 52 can comprise a dam, wall, a mirror, a light-blocking structure, a reflective structure, a filter, a black structure, a white structure, a transparent (clear) structure, or any other type of structure and/or material that is configured to divide, partition, or otherwise separate first light emitter zone $Z_1$ and second light emitter zone $Z_2$. In some aspects, intermediate structure 52 can be integrally formed with retention structure 48 and can comprise a same material as retention structure 48. Separating first light emitter zone and second light emitter zone $Z_1$ and $Z_2$, respectively, can be advantageous in providing a device that emits both a warmer color and a cooler color. For example, first zone $Z_1$ can be configured to emit a warmer color (e.g., a warm white, red, amber, etc.), and second zone $Z_1$ can be configured to emit a cooler color (e.g., a cool white, blue, etc.), or vice versa, for providing a customized light emission.

In some aspects, first zone $Z_1$ is configured to emit light having a lower correlated color temperature (CCT) than second zone $Z_2$, or vice versa. CCT is the proximity of the light source's chromaticity coordinates to the blackbody locus, as a single number rather than the two required to specify a chromaticity, which can be measured in Kelvin (K). For exemplary purposes only and in some aspects, at least one zone (e.g., $Z_1$ or $Z_2$) can be configured to emit light having a CCT of between approximately 1800K and 2400K, between approximately 2700K and 3000K, between approximately 3200K and 4800K, and/or between approximately 5000K and 6500K. As each zone (e.g., $Z_1$ or $Z_2$) is independently addressable (e.g., electrically independent), dimmable devices can also be provided, where current supplied to each color temperature zone is increased or decreased as desired. In some aspects, the color temperature or CCT associated with each zone (e.g., $Z_1$ or $Z_2$) can be configured and/or controlled based upon a string design, a chip design, and/or electrical current control.

Device 40B is configured to emit light from a first light emitter surface or area 50A and a second light emitter surface or area 50B that are disposed on opposing sides of intermediate structure 52. Each light emitter area 50A and 50B can comprise a regular shape that are not asymmetrical, and that has symmetry about at least one axis and/or multiple lines of symmetry.

FIG. 2C is another embodiment of a solid state light emitter device generally designated 40C. As FIG. 2C illustrates, each light emitter zone ($Z_1$ and $Z_2$) can be configured differently and/or have different features or characteristics. In some aspects, first zone $Z_1$ can comprise different physical and electrical configurations than second zone $Z_2$. For example, first zone $Z_1$ can comprise a different chip quantity, string quantity, chip-per-string configuration, chip spacing, string pattern, string spacing, etc., than second zone $Z_2$. In some aspects, first zone $Z_1$ can comprise a single string of serially connected light emitters 44 whereas second zone $Z_2$ can comprise multiple strings of serially connected light emitters 44. In further aspects, first zone $Z_1$ can comprise more light emitters per string than second zone $Z_2$. In further aspects, first zone $Z_1$ can comprise a fewer quantity of emitters 44 than second zone $Z_2$. In other aspects, first zone $Z_1$ can comprise a first chip spacing or pitch $P_1$ that is different from a second chip spacing or pitch $P_2$ associated with second zone $Z_2$.

In each zone (e.g., $Z_1$ and $Z_2$), light emitters 44 can be provided at equal distances from each other, or randomly spaced apart. In some aspects, light emitters 44 are spaced apart from each other by at least approximately 30 μm or more, at least approximately 50 μm or more, at least approximately 100 μm or more, at least approximately 200 μm or more, or more than 300 μm. In some aspects, first pitch $P_1$ can be smaller (e.g., tighter) than second pitch $P_2$. First pitch $P_1$ can differ from second pitch $P_2$ by +/−approximately 10 μm, by +/−approximately 50 μm, or by more than 100 μm.

The amount of current supplied to the zone having closer spaced or tighter packed light emitters can also differ for thermal purposes, where desired.

FIG. 2D is a further embodiment of a solid state light emitter device generally designated 40D. As FIG. 2D illustrates, each light emitter zone ($Z_1$ and $Z_2$) can be separated by a non-integral or separately formed intermediate dam or structure 54. In some embodiments, intermediate structure comprises a different material, color, shape, size, thickness, and/or reflective or non-reflective properties than retention structure 48. In some aspects, structure 54 is a reflector or a non-reflector. In other aspects, structure 54 comprises mirror and/or has mirrored surfaces. In other aspects, structure 54 is transparent (clear) for allowing light and colors to mix between the different zones. In further aspects, structure 54 can be used in combination with any type of wall or retention structure 48 that can be white (reflective), non-reflective, mirrored, faceted, smooth, transparent, or the like. Retention structures (e.g., 48, 52, 54, etc.) as described herein can comprise any suitable material, thickness, height, and/or shape (sectional or planar shape) configured to produce a color, beam, and/or pattern of light as suitable for many different lighting applications.

FIGS. 2A to 2D are for exemplary purposes only, and as will be appreciated by those of skill in the art, the multiple light emitter zones (e.g., $Z_1$ and $Z_2$) can differ in physical, electrical, and/or optical respects other than those specifically shown. For example, each zone can differ from one or more other zones in regards to a chip color, chip size, chip type, chip spacing, chip quantity, chip quantity per string, chip structure (e.g., vertical or horizontal), chip orientation/alignment with regards to other chips, chip patterns (e.g., linear and non-linear strings of chips), electrical configuration, electrical current supplied thereto, voltage, filler material, phosphor loading, phosphor content, any combination(s) thereof, or the like. Devices herein can comprise multiple light emitter zones that are customizable to provide light emitter devices operable at various electrical and/or optical specifications per customer and/or consumer requests.

FIGS. 3A to 3E schematically illustrate multiple light emitter zones disposed in a single solid state light emitter device according to the disclosure herein. Each device in FIGS. 3A to 3E can comprise a submount 62 and at least one retaining structure, dam, or wall 64. For illustration purposes only, FIGS. 3A to 3E illustrate light emitter zones (i.e., designated "Zone A", "Zone B", etc.) as being separated by one or more broken lines. The broken lines are used for illustration purposes only to illustrate possible placement of each light emitter zone relative to at least one other light emitter zone. In some aspects, the two or more light emitter zones can emit light from a same, single, undivided light emitter surface or area (e.g., FIG. 1C). In other aspects, the broken line illustrates placement of a barrier, dam, or wall that physically separates the light emitter surface or area (see e.g., FIGS. 2B to 2D) into two or more portions. Each light emitter zone can comprise a regular shape that is symmetrically disposed about at least one axis or plane. Regular shapes advantageously provide regular beam patterns or shapes useful in a variety of lighting applications.

Figure 3A:
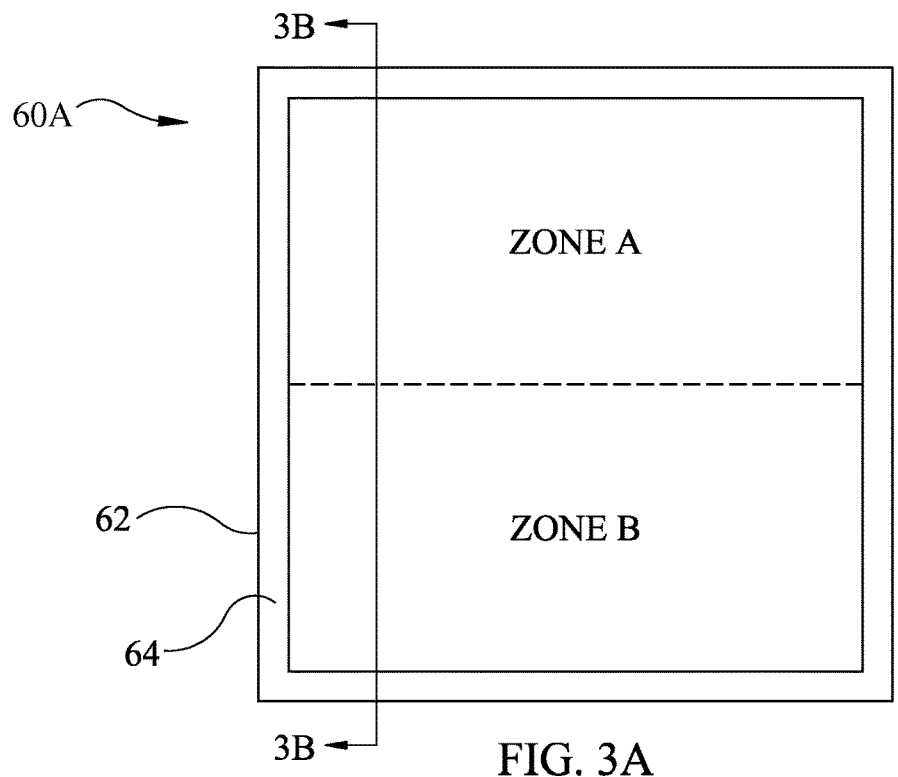
FIGS. 3A to 3E are schematic views illustrating multiple light emitter zones within a single light emitter device according to the disclosure herein.

FIG. 3A illustrates one embodiment of a light emitter device 60A that comprises a first light emitter zone designated "Zone A" and a second light emitter zone designated "Zone B". At least two electrically independent and individually operable zones can be provided. In some aspects, more than two zones are provided. Zone A and Zone B can be disposed directly adjacent to each other, with or without a wall, dam, or other retention structure therebetween.

Figure 3B:
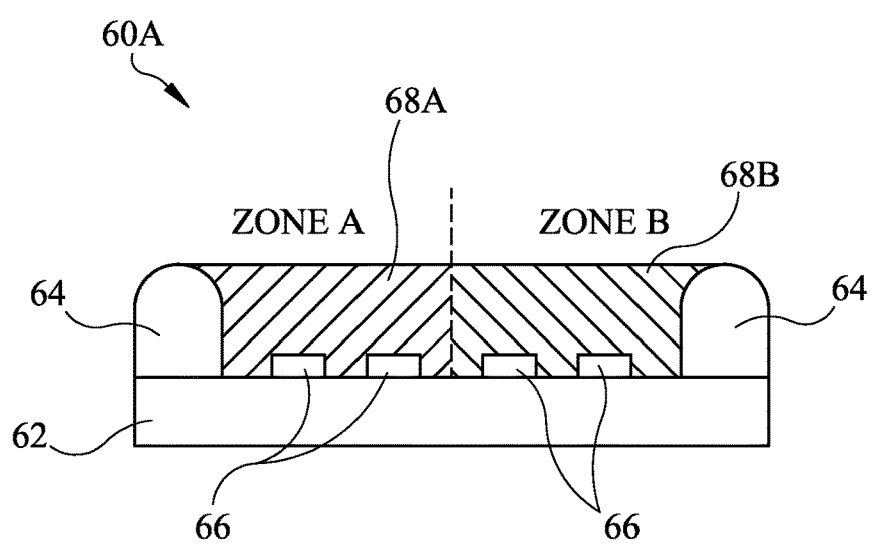

FIG. 3B is a sectional view of FIG. 3A. Each zone can comprise at least one, and in some aspects multiple light emitters 66. Where multiple emitters 66 are provided per zone, each light emitter can emit a same color per zone or different colors of light per zone. Emitters 66 in Zone A can differ from emitters 66 in Zone B in regards to the chip size, shape, color, quantity, structure, and/or electrical connectivity (e.g., series, parallel, or a combination thereof).

In some aspects, Zone A can comprise a first filler material 68A and Zone B can comprise a second filler material 68B. First filler material 68A and second filler material 68B can comprise a same material or different materials. Exemplary materials that can be used as filler materials 68A and 68B include silicone (e.g., any silicone carrier material, silicone resin, or silicone encapsulant), epoxy, resin, a transparent (clear) material, plastic, or the like. In some aspects, first filler material 68A and/or second filler material 68B can each comprise one or more phosphors, binders, reflective particles, diffusive particles, filtering particles, or the like, that are loaded or otherwise dispersed within the filler carrier material. Where used, the particles can be uniformly loaded or non-uniformly loaded.

In some aspects, first filler material 68A is substantially the same as second filler material 68B. In other aspects, first filler material 68A is not the same (different) as second filler material 68B. The differences between filler materials used in each zone can be structural, visual, optical, or chemical differences. For example, first material 68A can differ from second material 68B in regards to any of the materials used in providing the respective filler material, phosphor content, phosphor loading, phosphor type (e.g., chemical composition or color), the presence of light reflective, diffusing, and/or filtering particles, the filler color, the degree of filler transparency (e.g., varying in any degree from being optically clear to opaque), the presence of a texturized surface, or the like.

Figure 3C:
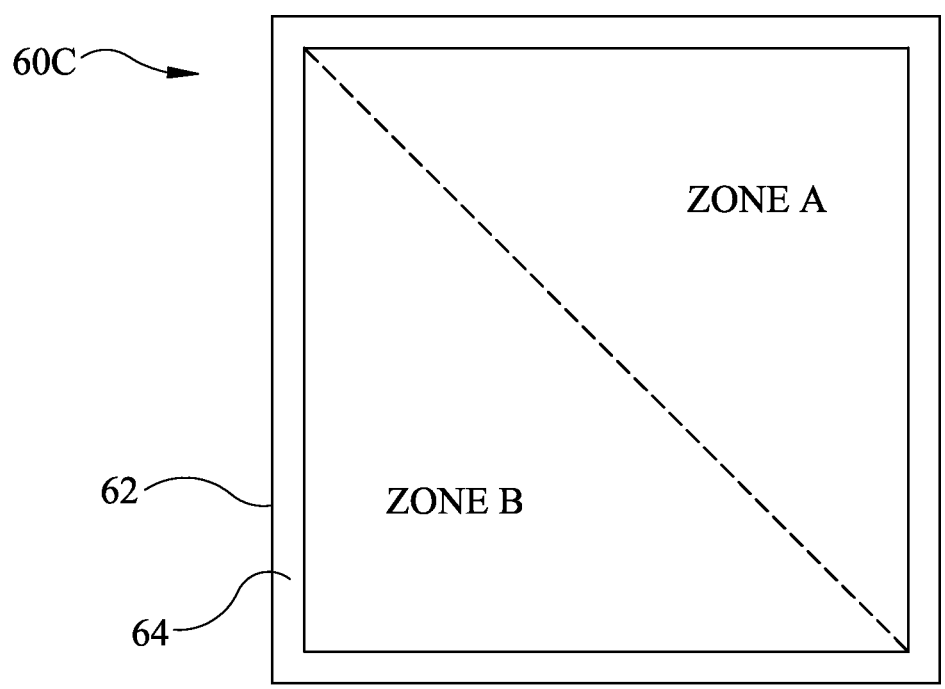

FIG. 3C illustrates another solid state light emitter device generally designated 60C. Device 60C can comprise independently controlled zones that receive electrical signal from independently controllable pairs of SMD contact pads (e.g., FIG. 1B) In some aspects, the zones are linearly arranged and/or parallel to each other over submount 62 (e.g., FIG. 3A). FIG. 3C illustrates non-parallel zones, which may be useful in providing different colors, patterns, and/or shaped beams of light. As FIG. 3C illustrates, at least two light emitter zones are provided over a single submount 62 and on a single device 60C. The zones can oppose each other and comprise non-square, triangular shapes spanning at least two edges and one corner of submount 62. Any different sizes and/or shapes of emitter zones can be provided per device.

Figure 3D:
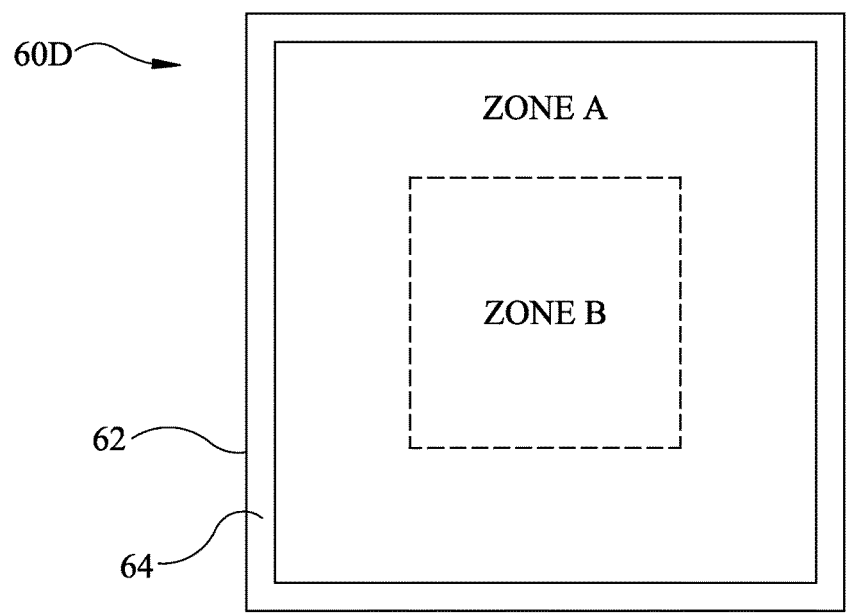

FIG. 3D is a further embodiment of a solid state light emitter device generally designated 60D. Device 60D comprises two con-centric and/or coaxial light emitter zones. Each zone is exclusive, discrete, and individually powered. Different light emitter zones can independently emit light, where the light emitted thereby can be the same color or different colors. Emitters disposed in each zone can be operable a same electrical current or different currents for providing a single device operable at different voltages. As FIG. 3D illustrates, Zone B is disposed proximate the center of submount 62, while Zone A surrounds all sides and the perimeter of Zone B. Zone B may run hotter than Zone A, as light emitters may be more densely packed therein. Thus, the electrical current provided to Zone B may be lower than the current being provided to Zone A. Electrical current can be strategically provided to each zone for providing a more efficient device having a higher quality of light.

Figure 3E:
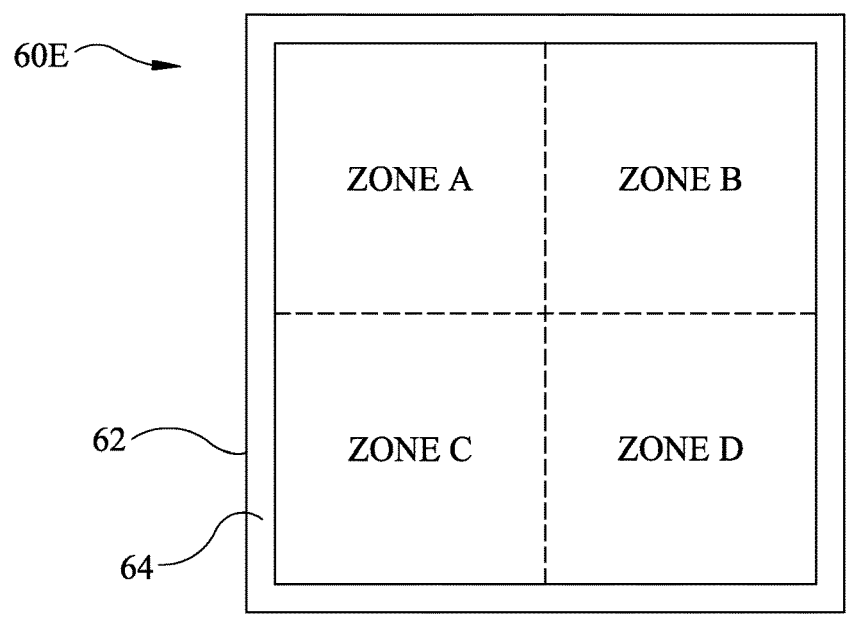

FIG. 3E is a further embodiment of a solid state light emitter device generally designated 60E. Device 60E comprises more than two independently controlled light emitter zones (i.e., Zone A to Zone D). Any two zones can emit light having the same optical properties (e.g., brightness, color, etc.) or each zone may emit light having different optical properties. Each zone can also comprise different physical, chemical, thermal, and/or electrical properties, where desired. Any number, location, size, and/or shape of light emitter zones can be provided over submount 62. The multiple zones emit light that is customized and/or configurable for use in many different lighting applications. In some aspects, each zone emits a different CCT for increasing the overall color rendering index (CRI). Combined emissions from the multiple zones per devices described herein embody a CRI value of at least 80, at least 85, or at least 90 or more.

In some aspects, devices described herein are configured to emit white light having a reference point on the blackbody locus (e.g., 1931 CIE Chromaticity Diagram) having a color temperature (e.g., CCT) of less than or approximately equal to 6500 K, less than or approximately equal to 5000 K, less than or approximately equal to 4000 K, less than or approximately equal to 3500 K, less than or approximately equal to 3000 K, or less than or approximately equal to 2700 K.

Solid state light emitter devices and methods herein can provide customized lighting components having improved color rendering and/or light emissions that are easily batched processed and produced. A multitude of different lighting devices, having customized colors, brightness, voltages, power, layout, sizes, and/or shapes can be provided without the expense of providing leadframe components.

Embodiments as disclosed herein may, for example and without limitation, provide one or more of the following beneficial technical effects: improved color rendering; improved color uniformity; improved color quality; reduced cost; reduced processing time; simplified processing; improved light extraction; improved brightness; and/or improved ability to vary component features or characteristics.

While the devices and methods have been described herein in reference to specific aspects, features, and illustrative embodiments, it will be appreciated that the utility of the subject matter is not thus limited, but rather extends to and encompasses numerous other variations, characteristics, modifications and alternative embodiments as will suggest themselves to those of ordinary skill in the field of the present subject matter, based on the disclosure herein. Various combinations and sub-combinations of the structures and features described herein are contemplated and will be apparent to a skilled person having knowledge of this disclosure.

Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A solid state light emitter device comprising:
   a submount comprising an upper surface and a bottom surface;
   first and second pairs of electrically conductive contacts disposed on the bottom surface of the submount, the first pair of electrically conductive contacts being electrically independent from the second pair of electrically conductive contacts, and each of the first and second pairs of electrically conductive contacts comprising an anode and a cathode; and
   multiple light emitters disposed on the upper surface of the submount, wherein the multiple light emitters are arranged as first and second light emitter zones that are electrically independent from each other and are separated by an uninterrupted and substantially linear gap along an entire length of the first and second light emitter zones,
   wherein the anode and the cathode of the first pair of electrically conductive contacts are arranged such that at least a portion of the anode and the cathode are adjacent to opposing edges of the submount, respectively, and
   wherein the anode and the cathode of the second pair of electrically conductive contacts are arranged such that at least a portion of the anode and the cathode are adjacent to the opposing edges of the submount, respectively.

2. The device of claim 1, wherein the first and second light emitter zones comprise a same quantity of light emitters.

3. The device of claim 1, wherein the first and second light emitter zones comprise a different quantity of light emitters.

4. The device of claim 1, further comprising a first pair of electrically conductive traces and a second pair of electrically conductive traces, both of which are disposed on the upper surface of the submount, wherein the first pair of electrically conductive traces is in electrical communication with the first pair of electrically conductive contacts, and the second pair of electrically conductive traces is in electrical communication with the second pair of electrically conductive contacts.

5. The device of claim 4, wherein the multiple light emitters are arranged in a plurality of strings of serially connected light emitters, wherein the first light emitter zone comprises two or more strings of the plurality of strings of serially connected light emitters and the second light emitter zone comprises one or more strings of the plurality of strings of serially connected light emitters, wherein the two or more strings of the first light emitter zone are disposed between the first pair of electrically conductive traces, wherein the one or more string of the second light emitter zone is disposed between the second pair of electrically conductive traces, wherein each of the two or more strings of the first light emitter zone are connected in parallel relative to each other, and wherein each string of the second light emitter zone is connected in parallel relative to each other when the second light emitter zone comprises a plurality of strings.

6. The device of claim 5, wherein the first light emitter zone comprises a different number of strings of serially connected light emitters than the second light emitter zone.

7. The device of claim 1, wherein light emitters in the first light emitter zone differ from light emitters in the second light emitter zone in regards to a chip size, a chip spacing, a chip structure, or a chip color.

8. The device of claim 1, wherein the first light emitter zone is configured to emit light having a different correlated color temperature (CCT) than the second light emitter zone.

9. The device of claim 1, further comprising a filler material disposed over the first and second light emitter zones.

10. The device of claim 9, wherein a continuous layer of the filler material is disposed over light emitters in the first and second light emitter zones.

11. The device of claim 9, wherein the filler material comprises a first portion of filler material disposed over the first light emitter zone and a second portion of filler material disposed over the second light emitter zone, the first and second portions being separated from each other by an intermediate retaining structure.

12. The device of claim 11, wherein the first portion of filler material differs from the second portion of filler material in regards to a phosphor type, a phosphor content, a phosphor loading, or an encapsulant material.

13. A solid state light emitter device comprising:
a submount;
a plurality of pairs of electrically conductive traces disposed over the submount, wherein each pair of electrically conductive traces is electrically independent from any other pair of the plurality of pairs of electrically conductive traces; and
a plurality of light emitters disposed over the submount, the plurality of light emitters being configured as a first light emitter zone between a first pair of the plurality of pairs of electrically conductive traces and a second light emitter zone between a second pair of the plurality of pairs of electrically conductive traces, wherein each light emitter is configured to emit light from a light emitter surface that has two lines of symmetry about a central axis of the submount, and wherein the first and second light emitter zones are separated from each other by an uninterrupted and substantially linear gap along an entire length of the first and second light emitter zones,
wherein all of the plurality of pairs of electrically conductive traces are disposed substantially adjacent to a perimeter edge of the submount and have a shape that is a same shape as a portion of at least three external sides of a perimeter of the submount to which a respective one of the plurality of pairs of electrically conductive traces are substantially adjacent.

14. The device of claim 13, wherein the first and second light emitter zones comprise a same quantity of light emitters.

15. The device of claim 13, wherein the first and second light emitter zones comprise a different quantity of light emitters.

16. The device of claim 13, wherein each pair of electrically conductive traces is in electrical communication with a respective pair of electrically conductive contacts and wherein each electrically conductive contact of each respective pair of electrically conductive contacts is disposed at a perimeter edge on a bottom surface of the submount.

17. The device of claim 13, wherein the plurality of light emitters are arranged in multiple strings of serially connected light emitters, each of which are disposed between a respective one of the plurality of pairs of electrically conductive traces, and wherein each string of the multiple strings of serially connected light emitters is connected in parallel with respect to each other string of the multiple strings of serially connected light emitters that is connected to a same pair of the plurality of pairs of electrically conductive traces.

18. The device of claim 17, wherein the first and second light emitter zones comprise a different number of the multiple strings of serially connected light emitters.

19. The device of claim 13, wherein light emitters in the first light emitter zone comprise a different chip size, a different chip spacing, a different chip structure, or a different chip color than light emitters in the second light emitter zone.

20. The device of claim 13, wherein each light emitter zone is configured to emit light having a different correlated color temperature (CCT).

21. The device of claim 13, further comprising a filler material disposed over the first and second light emitter zones.

22. The device of claim 21, wherein a continuous, undivided layer of filler material is disposed over light emitters in the first and second light emitter zones.

23. The device of claim 21, wherein the filler material comprises a first portion of filler material disposed over the first light emitter zone and a second portion of filler material disposed over the second light emitter zone, the first and second portions being separated from each other by an intermediate retaining structure.

24. The device of claim 23, wherein the first portion of filler material differs from the second portion of filler material in regards to a phosphor type, a phosphor content, a phosphor loading, or an encapsulant material.

25. A method of providing a solid state light emitter device, the method comprising:
providing a submount comprising an upper surface and a bottom surface;
providing first and second pairs of electrically conductive contacts on the bottom surface of the submount, the first pair of electrically conductive contacts being electrically independent from the second pair of electrically conductive contacts, and each of the first and second pairs of electrically conductive contacts comprising an anode and a cathode;
providing multiple light emitters on the upper surface of the submount; and
arranging the multiple light emitters into first and second light emitter zones that are electrically independent from each other and are separated from each other by an uninterrupted and substantially linear gap along an entire length of the first and second light emitter zones,
wherein the anode and the cathode of the first pair of electrically conductive contacts are arranged such that at least a portion of the anode and the cathode are adjacent to opposing edges of the submount, respectively, and
wherein the anode and the cathode of the second pair of electrically conductive contacts are arranged such that at least a portion of the anode and the cathode are adjacent to the opposing edges of the submount, respectively.

26. The method of claim 25, wherein the first and second light emitter zones comprise a same quantity of light emitters.

27. The method of claim 25, wherein the first and second light emitter zones comprise a different quantity of light emitters.

28. The method of claim 25, further comprising electrically connecting each of the multiple light emitters to either a first pair or a second pair of electrically conductive traces disposed on the upper surface of the submount, wherein the first pair of electrically conductive traces is in electrical communication with the first pair of electrically conductive contacts and the second pair of electrically conductive traces is in electrical communication with the second pair of electrically conductive contacts.

29. The method of claim 28, further comprising arranging the multiple light emitters in multiple strings of serially connected light emitters and connecting each of the multiple strings between the first or second pairs of electrically conductive traces, respectively, wherein each string of the multiple strings of serially connected light emitters is connected in parallel with respect to each other string of the multiple strings of serially connected light emitters that is connected to a same of the first or second pairs of electrically conductive traces.

30. The method of claim 29, wherein the first light emitter zone comprises a different number of the multiple strings of serially connected light emitters than the second light emitter zone.

31. The method of claim 25, further comprising providing different chip sizes, chip spacings, chip structures, or chip colors in the first and second light emitter zones.

32. The method of claim 25, further comprising emitting light from the first light emitter zone that has a different correlated color temperature (CCT) than the second light emitter zone.

33. The method of claim 25, further comprising dispensing a filler material disposed over the first and second light emitter zones.

34. The method of claim 33, wherein a continuous layer of the filler material is dispensed over light emitters in the first and second light emitter zones.

35. The method of claim 33, wherein the filler material comprises a first portion of filler material disposed over the first light emitter zone and a second portion of filler material disposed over the second light emitter zone, the first and second portions being separated from each other by an intermediate retaining structure.

36. The method of claim 35, wherein the first portion of filler material differs from the second portion of filler material in regards to a phosphor type, a phosphor content, a phosphor loading, or an encapsulant material.

* * * * *